(12) United States Patent
Nikoobakht

(10) Patent No.: US 8,449,673 B2
(45) Date of Patent: May 28, 2013

(54) METHOD AND APPARATUS FOR PRODUCING NANOCRYSTALS

(75) Inventor: Babak Nikoobakht, Potomac, MD (US)

(73) Assignee: Babak Nikoobakht, Potomac, MD (US)

( * ) Notice: Subject to any disclaimer, the term of this patent is extended or adjusted under 35 U.S.C. 154(b) by 919 days.

(21) Appl. No.: 12/543,485

(22) Filed: Aug. 18, 2009

(65) Prior Publication Data

US 2010/0058978 A1 Mar. 11, 2010

Related U.S. Application Data

(60) Provisional application No. 61/090,896, filed on Aug. 22, 2008.

(51) Int. Cl.
*C30B 11/00* (2006.01)
*C30B 7/00* (2006.01)
*C30B 31/02* (2006.01)
*C30B 28/06* (2006.01)
*C30B 35/00* (2006.01)

(52) U.S. Cl.
USPC .................. 117/68; 117/11; 117/70; 117/200

(58) Field of Classification Search
USPC ........................................ 117/11, 68, 70, 200
See application file for complete search history.

(56) References Cited

U.S. PATENT DOCUMENTS

| | | | |
|---|---|---|---|
| 7,311,774 B2 * | 12/2007 | Alivisatos et al. | 117/68 |
| 7,517,466 B2 * | 4/2009 | Asakawa et al. | 216/41 |
| 2002/0085968 A1 * | 7/2002 | Smalley et al. | 422/198 |
| 2002/0136681 A1 * | 9/2002 | Smalley et al. | 423/447.2 |
| 2006/0068026 A1 * | 3/2006 | Hu et al. | 424/618 |
| 2007/0204790 A1 * | 9/2007 | Alkhawaldeh et al. | 117/68 |
| 2009/0084307 A1 * | 4/2009 | Cao et al. | 117/11 |
| 2010/0058978 A1 * | 3/2010 | Nikoobakht | 117/68 |
| 2012/0292255 A1 * | 11/2012 | Nikoobakht | 210/650 |

* cited by examiner

Primary Examiner — James McDonough

(57) ABSTRACT

The present disclosure describes a method and an apparatus for making nanomaterials. In particular, the present innovation provides an apparatus that can be used to produce nanocrystals and/or nanorods of noble metals. The disclosure also provides methods that can be advantageously used to produce gold nanocrystals/nanorods with aspect ratios higher than 4.0.

29 Claims, 6 Drawing Sheets

Seed Generating

METHOD AND APPARATUS FOR PRODUCING NANOCRYSTALS

CROSS-REFERENCE TO RELATED APPLICATION

The present application claims priority to U.S. Provisional Application No. 61/090,896, filed Aug. 22, 2008, the disclosure of which is herein incorporated by references in its entirety

STATEMENT REGARDING FEDERALLY SPONSORED RESEARCH OR DEVELOPMENT

Not Applicable.

REFERENCE TO SEQUENCE LISTING, A TABLE, OR A COMPUTER PROGRAM LISTING COMPACT DISC APPENDIX

Not Applicable.

FIELD OF THE INVENTION

The present disclosure generally relates to nanomaterials, and more particularly relates to methods and devices for producing nanoparticles such as nanocrystals and/or nanorods.

BACKGROUND OF THE INVENTION

Nanoparticles made of metals, semiconductors, or oxides are of interest for their mechanical, electrical, magnetic, optical, chemical and other properties. Noble metal nanostructures are of much interest because of their unique properties, including large optical field enhancements resulting in the strong scattering and absorption of light. The fields that are being impacted by the advancement in nanostructured materials include different areas such as electronics, materials, biology, medicine and other branches of physical sciences. To this end and as an example, gold nanoparticles are one of the most widely used classes of nanomaterials for chemical, bioanalytical, biomedical, optical and nanotechnological applications. While there are numerous methods known for the synthesis of gold nanoparticles, the ability to control the size, aspect ratio, shape and monodispersity of gold nanoparticles remains challenging and one of the main areas of research.

One important morphology of gold nanoparticles is rod- or cylindrical-shaped. Particles with this shape are called nanorods with typical dimensions ranging from 1-100 nm. Compared to other shapes of nanoparticles including spheres and shells, nanorods are more favorable for in-vivo applications due to their tunable optical resonance in the near infra-red region (NIR). Moreover, their relative scattering to absorption contribution can be easily tuned by a change in their dimensions. Gold nanorods offer superior NIR absorption and scattering at much smaller particle sizes. Smaller sized nanorods also offer better cell uptake as compared to the larger nanoshells and nanospheres. This, in addition to the potential noncytotoxicity of the gold material, easy optical tunability, and facile synthesis, makes gold nanorods promising nanoparticle agents for use in biomedical imaging and photothermal therapy applications.

Nanorods are often characterized by their aspect ratios, which is defined as the length to the width of a nanorod. A larger aspect ratio means a longer nanorod. Their width typically range from 5 nm to 30 nm and their length is about 20 nm or more. The state-of-the-art synthesis methods produce gold nanorods with aspect ratios less than 4.5 with no control over concentration of nanospheres [1, 2]. Gold nanorods with aspect ratios more than 4.5 are of interest due to their absorption in the NIR region of the spectrum.

Typical strategies for producing gold nanorods include: electrochemical methods [3], photochemical [4], and seed-based growth methods [1, 2]. In all these methods, gold nanorods are produced by reduction of a gold salt in the presence of a soft template in an aqueous solution. In electrochemical methods, a gold nanorod starts from a small gold nanoparticle and gradually grows to a rod-shaped object. Some limitations of this method are: a) high concentration of nanospheres compared to nanorods, b) lack of control over the length of the nanorods, and c) irreproducible results. In seed-based growth methods, 3-5 nm gold nanoparticles are used as seeds for growth of nanorods. The seed-mediated growth method was originally developed in laboratory test tubes for producing small amount of nanorods. Since its full development, this method has not been modified significantly and still small volumes of nanorods are prepared. New designs are necessary to overcome these limitations. As a mean to evolve this process towards more automated designs, a microfluidic flow process which contained micron size channels has also been used; however, this platform still has the weak points of the original growth method [5]. The disclosed invention overcomes the weak points and the inhomogeneities in nanorods growth present in the conventional approaches.

BRIEF SUMMARY OF THE INVENTION

The following presents a simplified summary in order to provide a basic understanding of some aspects of the disclosed innovation. This summary is not an extensive overview, and it is not intended to identify key/critical elements or to delineate the scope thereof. Its sole purpose is to present some concepts in a simplified form as a prelude to the more detailed description that is presented in the following sections.

In one aspect of the innovation, a nanocrystal forming apparatus is described that includes a seed generating unit with an anterior end and a posterior end; a first inlet located at the anterior end of the seed generating unit for receiving a first solution; a second inlet formed on a side wall of the seed generating unit near the anterior end for receiving a second solution; an outlet formed on a side wall in the lower half of the seed generating unit; a first membrane substantially covering the second inlet; a second membrane covering the lower outlet; a growth solution unit with a distal end and a proximal end; and a means for causing motion operably connected to the seed generating unit such that when the motor is operated the seed generating unit is caused to move through the growth solution unit.

In another aspect of the innovation, a method for producing nanocrystals using said apparatus is described that involves providing a first flow solution comprising noble metal ions and a cationic surfactant into a seed generating unit; providing a second flow solution comprising a reducing agent in to the seed generating unit; passing the second flow solution through a membrane covering the second inlet of the seed generating unit; causing the contact of the first flow solution with the second flow solution, such that the contact of the first flow solution with the second flow solution generates nanoparticle seeds; and causing the movement of the nanoparticle seeds to a growth unit containing a growth solution through an outlet of the seed generating unit. The contact between the nanoparticle seeds and the growth solution resulting from the motion of the seed generating unit inside the growth unit produces nanocrystals.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and is intended to include all such aspects and their equivalents. Other advantages and novel features will become apparent from the following detailed description when considered in conjunction with the drawings.

DETAILED DESCRIPTION OF THE INVENTION

Figure 1:
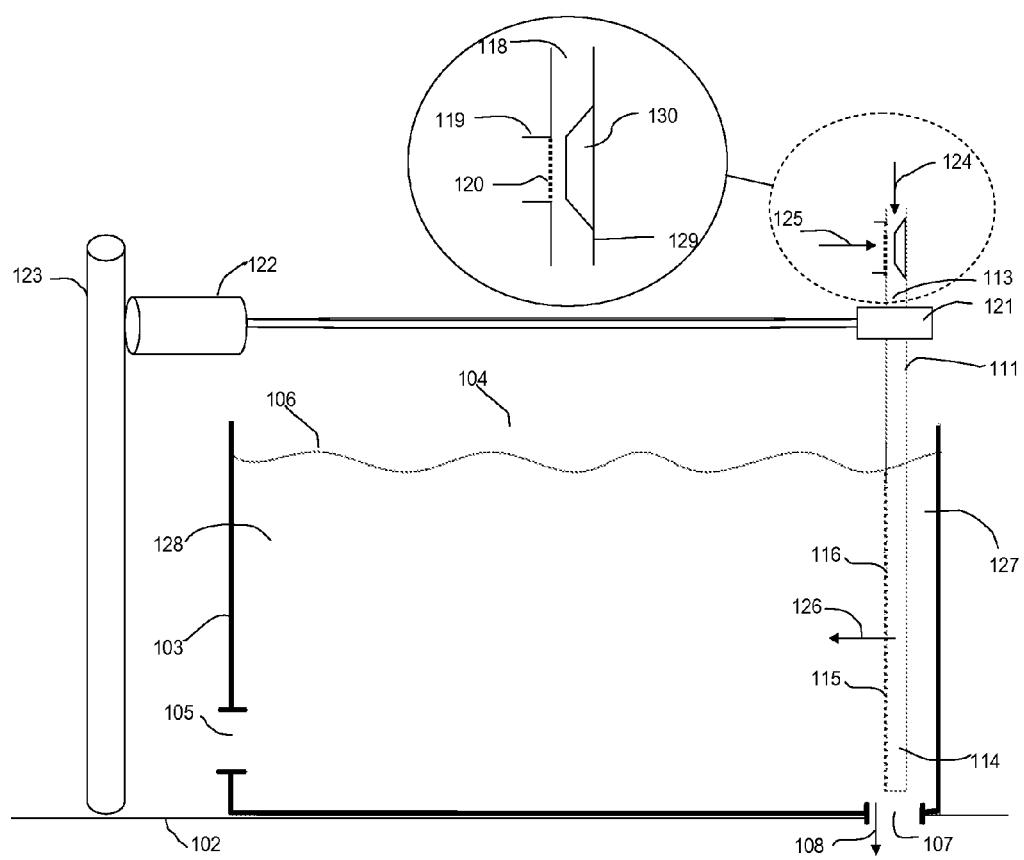
FIG. 1 shows a front view of an apparatus for forming nanorods according to one aspect of the disclosure. Platform has three main sections, a nanorod growth tank, a seed generating unit and a base that holds the entire apparatus. Inset shows a closer view of the upper portion of the seed generating unit, where the metal ions, surfactants and reducing agents are mixed. In one aspect of the disclosure, the lower section of the seed generating unit resides in a growth solution inside the growth tank.

The innovation is now described with reference to the drawings, wherein like reference numerals are used to refer to like elements throughout. In the following description, for purposes of explanation, numerous specific details are set forth in order to provide a thorough understanding thereof. It may be evident, however, that the innovation can be practiced without these specific details. In other instances, well-known structures and devices are shown in block diagram form in order to facilitate a description thereof.

The disclosure is focused on gold nanorod formation as an exemplary embodiment. However, the method and apparatus disclosed herein can be readily adapted to produce nanomaterials of other noble metals such as silver, copper, platinum, and the like. A person skilled in the art would appreciate that the methods and apparatus disclosed herein can be adapted to preparation of other nanomaterials without undue experimentation and as such the scope of the disclosure is intended to include all those applications. Also, whenever the disclosure refers to gold nanorods or gold ions, it is to be understood that other noble metals may take the place of gold.

The present disclosure provides for a method of making substantially monodisperse gold nanocrystals. The disclosure further describes an apparatus for making substantially monodisperse gold nanocrystals. The apparatus and methods of the disclosure overcome some of the shortcomings of currently available methods by optimizing the formation of nanoparticle seeds and then subsequently optimizing the growth of nanorods by introducing the seeds directly into a bulk growth solution.

The common practice in the seed-assisted growth of nanorods has been the addition of a small volume of a gold seed solution, usually 10 to 1000 microliter, to a nanorod growth solution [1, 2]. With these methods, even with a near 100% seed to nanorod growth yield, the nanorod concentration remains low, which is indicative of a small and limited number of the initially added gold seeds to a growth solution. However, addition of a large volume of gold seeds, e.g., 1 ml or more, results in high concentration of nanospheres and thus very low yield of nanorods. There are at least two factors that significantly change the width and length distributions of nanorods: 1) seed particle size distribution and 2) seed injection mechanism. Size distribution broadening of gold seeds can originate from the way the reagents (gold ions and its reducing agent) are mixed in the seed preparation step. The size broadening of seed particles, in nanorod growth step, results in variation in width of the nanorods. On the other hand, injection of a seed solution to a growth solution locally increases the seed concentration. Due to this local concentration of seeds, each seed experiences a different growth media, thus resulting in nanorods with different lengths.

As used in this application, the term "nanorod" is intended to include solid cylindrical objects less than 1000 nm in size. In this application, the following terms are meant to be synonymous with "nanorod": rod shaped gold nanocrystals, cylindrical shaped gold nanocrystal, spheroidal shaped gold nanocrystal, gold nanorods, and one dimensional gold nanocrystals. The term "nanocrystal" is intended to include tiny crystals less than 1000 nm in size. The term "nanoparticle" is intended to include nanocrystals with different shapes with a size less than 100 nm. The term "seed" is meant to refer to a nanoparticle that acts as a nucleation site from which a rod shaped nanocrystal will grow. The disclosure uses the term "seed" interchangeably with the term "nanoparticle" or metal seed. The term "seed generating unit" refers to a mixing chamber specially designed to receive a gold ion/noble metal ion solution and a reducing agent to produce metal seeds. The term "seed dispensing unit" refers to a container, with an outlet made from a porous membrane, particularly designed for dispensing noble metal seeds to a growth solution. The term "gold ion solution/noble metal solution" refers to a solution containing noble metal ions and cationic surfactants. The term "cationic surfactant" refers to any substance that lowers the surface energy of nanoparticles, has a nonpolar tail and a polar head carrying a counter ion. The term "reducing agent" is intended to include any compound that easily loses electrons in a reduction-oxidation reaction, thereby reducing other species. The term "growth solution" refers to a solution, which promotes the growth of nanorods when in contact with seeds. This solution contains a surfactant mixture, metal ions and a mild reducing agent. The term "growth tank" refers to a tank filled with a growth solution where the seeds are dispersed to be grown into nanorods. The term "membrane"

refers to any porous material containing pores in the nanometer range. The term "nanochannels" refers to nanosized passages that are located in the membrane. For the purpose of this disclosure, nanochannels are synonymous with membrane pores.

According to one aspect of the disclosure, an apparatus is described that can be used in the production of gold nanorods. The apparatus comprises a seed generating unit that allows for optimal size and quantity of gold seeds to be formed. Through the seed generating unit, the gold seeds are transferred to a growth solution via a membrane installed at the end outlet of this unit. According to another aspect of the innovation, the present disclosure provides a method for forming gold nanorods. The disclosed method involves combining a reducing agent (ex. a strong reducing agent) with a metal ion/surfactant solution to form nanoparticle seeds, injecting the nanoparticle seeds directly into a growth solution such that an optimal yield of nanorods is produced. In another aspect of the innovation, gold nanorods, covered with a surfactant mixture, are further grown to desired aspect ratios. The method and apparatus disclosed herein can be used to produce large volumes of nanorods with desirable aspect ratios. Furthermore, the apparatus and method disclosed can be scaled up for large scale production of nanorods.

According to one aspect of the present disclosure, as shown in FIG. 1, an apparatus is provided that would enable making of nanorods. In one embodiment of the innovation, the apparatus includes a base (102) on which are placed a growth tank (103), and a seed generating unit (111).

The base of the apparatus (102) can maintain the apparatus as a single unit. The base (102) can be made of any inert material, such as plastics, inert polymers, and is of sufficient dimensions to accommodate structures that will be described below. In one exemplary embodiment of the present disclosure, the dimensions of base (102) can be any where from about 12×12×12 inches (L×W×H) to about 48×48×48 inches (L×W×H). The base can be of any suitable shape as long as it is sufficient to accommodate the other parts of the apparatus and can provide some stability to the apparatus. For example, the base can be square or rectangular.

In some embodiments, the growth tank (103) is formed over the base (102) using appropriate materials. In some other embodiments, the growth tank (103) can be separately formed and placed over/attached to the base (102). The growth tank (103) can be attached to the base (102) by any well known means for securing. In another embodiment, the base and the growth tank can be formed as a single unit rather than being two individual units. The growth tank (103) can be made of any suitable material that does not interfere with the nanorod formation. For example, the growth tank can be made of polymers such as acrylic glass, polycarbonate, polyethylene etc. In one embodiment, as depicted in FIG. 1, the tank is rectangular in shape, and can have an open top (104). The dimensions can be optimized in such a way as to achieve the desired yield and shape of the nanorods. In one specific embodiment, the tank dimensions (L×H×W) can be any where from about 3×3×1 inches to about 48×48×48 inches. In one specific embodiment, the dimensions of the growth tank can be approximately 12×12×1.5 inches. The growth tank can have suitable capacity depending on the application. For example, the growth tank can have a capacity from about 100 ml to about 1000 liter. In one specific embodiment, the growth tank has capacity of 3300 ml. The tank can include an opening/inlet (105), which can be used to fill the tank with a growth solution (106). The tank (103) has a top section (104) open so that the seed generating unit (111) can be placed into the growth tank. The tank includes a proximal end (127) and a distal end (128) at the opposing side. In one example, the seed generating unit (111) can be placed near the proximal end before starting the reaction.

The tank (103) can also optionally include an outlet (107), which can be used to collect/remove the final product (108). The capacity of the growth tank (103) can be adjusted based on the desired production level of nanorods. In one embodiment of the apparatus the growth tank (103) has a width approximately equal to the width of the seed generating unit (111). The widths of the two tanks are adjusted such that the seed generating unit (111) can be placed into the growth solution (106), and also to optimize the surface area of the seed generating unit (111) that is in contact with the growth solution (106). Before the apparatus can be used, the seed generating unit (111) can be located at one end of the growth tank (103). The width of the growth tank (103) can be from about 0.5 inches to about 48 inches (or higher). The width of the seed generating unit (111) can be from about 0.5 inches to about 48 inches (or higher).

In one embodiment, the seed generating unit (111) is made from acrylic glass. In one embodiment of the apparatus, the seed generating unit (111) is an elongated, rectangular unit. The seed generating unit can be made in other shapes or geometries such as a cylinder. The shape can be chosen such as to optimize the production of nanorods. The seed generating unit (111) can have two ends, an anterior end (113) and a posterior end (114). The posterior end is the end of the seed generating unit (111) that is submerged in the growth solution (106). In one embodiment, the posterior end (114) is inserted into the growth tank (103) at or near the proximal end (127) of the tank. In one embodiment of the disclosure, a significant portion of the seed generating unit (111) is submerged within growth solution (106). In one embodiment of the disclosure, the seed generating unit (111) is submerged such that the posterior end (114) is close to the bottom of the growth tank (103). The depth to which the seed generating unit (111) is submerged can be chosen to optimize the production of nanorods.

Figure 2:
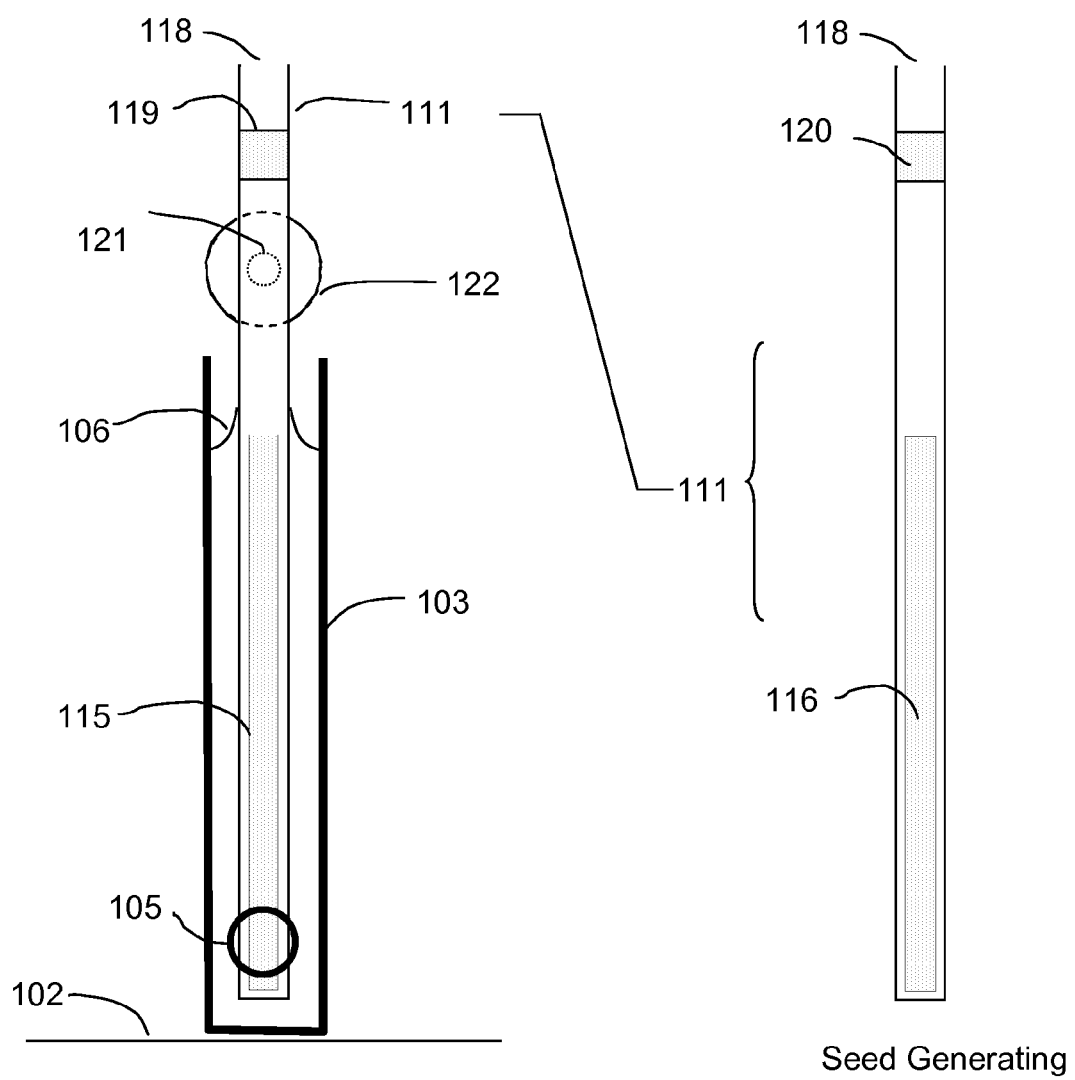
FIG. 2 illustrates a side view of an apparatus for forming nanorods according to one aspect of the disclosure. This figure shows a seed generating unit placed in a growth tank. The seed generating unit independently is illustrated in the right side of the figure. In one aspect of the disclosure, the seed generating unit includes two nanoporous membranes in its upper and lower parts.

In one embodiment, shown in FIG. 2, a portion of one sidewall of the seed generating unit (111) that is in contact with the growth solution (106) contains or replaced with a porous membrane (116) containing an array of nanochannels/pores (FIG. 2). In another embodiment, a substantial portion of one sidewall of the seed generating unit (111) that is in contact with the growth solution (106) contains or replaced with a porous membrane (116). The dimensions of the sidewall of the seed generating unit that can contain the porous membrane may be chosen to maximize the production of nanorods. The membrane (116) can be attached to the sidewall using any known means or construction methods. The pores of the membrane can form channels that can function as a plurality of outlets (115) that can be used to transfer materials from seed generating unit to the growth tank. The membrane is chosen such that when a reactant travels through the outlets (115) the contact between the seeds and the growth solution is maximized. In the one specific embodiment of the disclosure, as depicted in FIG. 1, the sidewall of the seed generating unit (111) containing the membrane outlets (115) is the wall facing the distal end of the growth tank (128). The sizes of the nanochannels or pores diameters can range from about 10 nanometers to about 500 nanometers. Any porous membrane with pores of appropriate size and which do not react with the chemicals used to form the nanorods may be used. The porous membrane can made of aluminum oxide, but can also be made of polycarbonate, silver, nylon, Polytetrafluoroethylene (PTFE), etc.

As illustrated in FIG. 1, a portion of the seed generating unit (111) extends substantially out of the tank (103). At the far anterior end (113), the seed generating unit (111) contains two openings/inlets (118, 119). These openings/inlets are used to introduce reactants (124, 125) into the seed generating unit. In one embodiment, shown in the inset of this figure, the first opening/inlet (118) is located at or near the tip of the anterior end of the seed generating unit. The second opening/inlet (119) is formed by having a portion of a side wall of the seed generating unit being composed of/having a porous membrane (120) containing pores or nanochannels. The sidewall containing the membrane (120) can be formed using any known means. For example, a portion of the side wall can be replaced with a membrane by using well known means. The walls that will contain the membrane may be chosen to maximize the production of nanorods. The diameter of the nanochannels/pores can range in size from about 10 to about 500 nanometers. The porous membrane can be made of aluminum oxide, but can also be made of other suitable materials such as polycarbonate, silver, nylon, Polytetrafluoroethylene (PTFE), etc.

Figure 3:
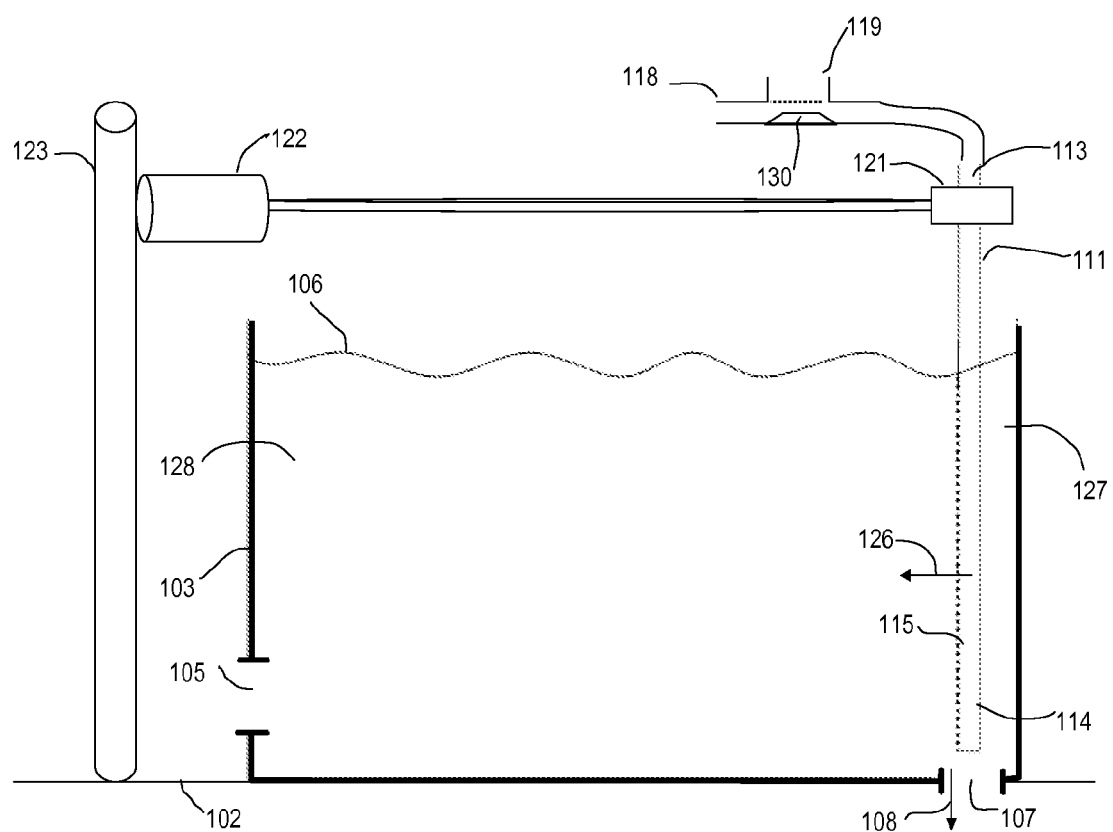
FIG. 3 depicts a front view of an apparatus for forming nanorods according to one aspect of the disclosure. In this design, the seed generating unit is divided to two subsections that are connected through a flexible hose or tubing.

In one embodiment, the second opening/inlet (119) is located on the same side as that of the outlet (115). In another embodiment of the disclosure as depicted in FIG. 3, the seed generating unit can be formed of/split to two sequential units connected using proper means (for example, via a flexible tubing). In one embodiment, the first opening/inlet (118) receives a first solution containing gold ions and a cationic surfactant. The cationic surfactant can be a cetyltrimethylammonium halide. In one embodiment, the cationic surfactant may be cetyltrimethylammonium bromide. Other cationic surfactants that may be used include, but not limited to, cetylpyridinium chloride (CPC), polyethoxylated tallow amine (POEA), benzalkonium chloride (BAC), benzethonium chloride (BZT), and benzyldimethylammonium chloride (BDAC). The gold ion solution may comprise a solution from about 0.0001M to about 0.004M $HAuCl_4$ and from about 0.08M to about 0.2M cetyltrimethylammonium bromide. The volume of the gold ion solution can be chosen depending upon the application. In one example, it can be anywhere from about 50 ml to about 200 ml. In one exemplary embodiment, the gold ion solution comprises: 100 ml solution of $HAuCl_4$ (0.00025 M), and cetyltrimethylammonium bromide (CTAB, 0.1 M). To produce nanorods of other noble metals, the gold ion solution may be replaced with other noble metal ion solution such as silver, copper, and platinum. However, a person skilled in the art would appreciate that some of the reaction conditions have to be modified to obtain optimal results.

The second flow solution, introduced through the second inlet (119), comprises a reducing agent (125). The reducing agent can be any chemical that is capable of reducing the metal ions present in the metal ion solution. In one embodiment, the reducing agent can be a strong reducing agent. In one embodiment, the reducing agent can be sodium borohydride. The reducing agent may also be lithium aluminum hydride ($LiAlH_4$), nascent hydrogen, or hydrazine, etc. The concentration of sodium borohydride may range from about 0.001M to about 0.04M. In one specific example, the reducing agent is 6 ml of 0.01 M $NaBH_4$.

Figure 4:
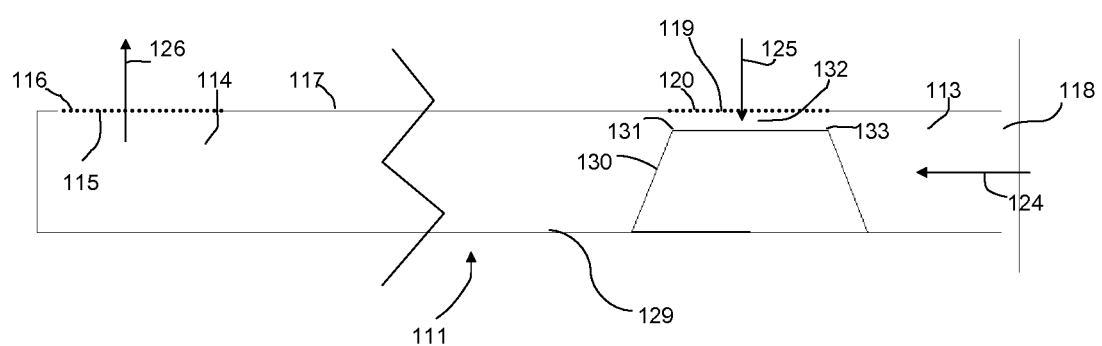
FIG. 4 is a cross sectional view of the upper part of a seed generating unit according to one aspect of the disclosure. This figure shows the point where the reducing agent reacts with the metal ions and surfactants. This area is considered the "active zone"; according to one aspect of the disclosure the internal diameter of the unit narrows at this point where the second opening/inlet is located.

In one aspect of the disclosure, the seed generating unit is designed in such a way as to optimize the contact between the reactants. Any suitable means can be used for reducing or narrowing the width of the seed generating unit at the point where the reactants contact each other. FIG. 4 shows a sectional view of the seed generating unit (111) at the point of the second opening/inlet (119) according to one embodiment of the invention. The side wall (129) of the seed generating unit opposite to the second opening/inlet (119) has a structure (130) for narrowing the width of the seed generating unit. In one embodiment, the structure for narrowing is in the form of a protrusion (130). The protrusion in some embodiments can be trapezoid in form. The protrusion (130) reduces the width of the seed generating unit (111) at the point where the second opening/inlet connects with the seed generating unit. This structure can facilitate controlled seed formation and growth when the two solutions (124, 125) contact each other. When the concentrations of the two solutions (124, 125) are appropriately chosen, the seed formation reaction can be substantially completed by the time the mixed solutions pass the trailing edge (131) of the structure (130). The structure can be shaped in any form that will reduce or narrow the width of the of the seed generating unit at the point where the reactants contact each other.

In FIG. 1, the seed generating unit (111) is operably connected to a means (121,122) to facilitate the movement of the seed generating unit. In one example, in between the second opening/inlet (119) and the top of the tank (103), a retaining bar (121) is connected to the seed generating unit (111). In one embodiment as depicted in FIG. 1, the retaining bar (121) connects to the seed generating unit (111) by a friction fit. However, any known methods of connection can be used. A motor (122) may be operably attached to the retaining bar such that when the motor (122) is operated, the retaining bar will move horizontally along the axis (right to left) of the tank (103). Because the retaining bar (121) is attached to the seed generating unit (111), when the retaining bar (121) is moved, it will in turn pull the seed generating unit (111) horizontally along the length axis (right to left) of the growth tank (103). The motor may be held in place by any suitable means (ex. a retaining pole) (123). The retaining pole (123) can be held in place through attachment to the base (102). Other known means of translating motion can be used to move the seed generating unit (111).

Figure 5:
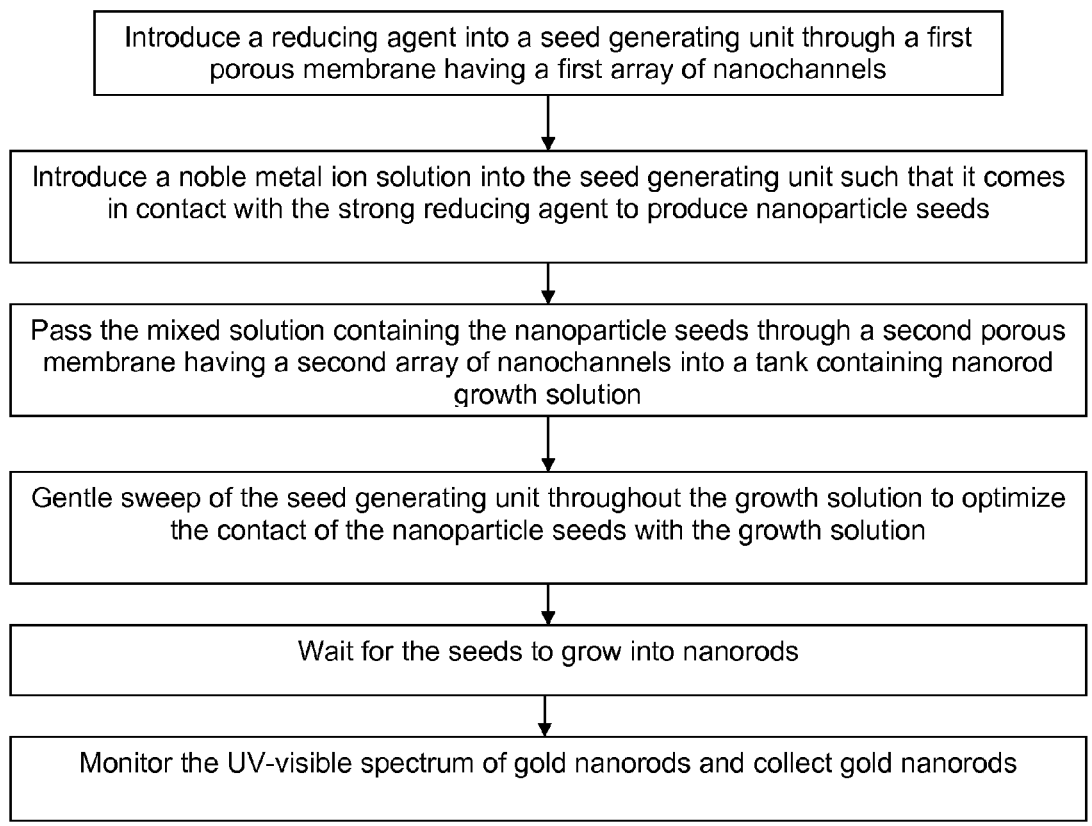
FIG. 5 is a flow chart illustrating a method for forming nanorods with aspect ratio less than 4.5 according to one aspect of the invention.

In another aspect of the disclosure, a method of making nanorods using said apparatus is described. The flowchart of the process as shown in FIG. 5 involves introducing a reducing agent into a seed generating unit through a first membrane (119), introducing the gold ion solution/surfactant mixture via an inlet (118) and combining the two solutions at the active zone (132) to form gold seeds (FIGS. 1, 4). Gold seeds are then entered into a growth solution through a second membrane (116) to grow into gold nanorods.

The growth tank (103) can be filled with a growth solution (106) by means of the tank opening/inlet (105). The growth tank also can be filled with the growth solution using the open top section. The seed generating unit (111) can be placed into the growth tank such that the porous outlet (115) is completely submerged in the growth solution. The motor (122) can be operationally coupled to the seed generating unit (111) using proper means (ex. retaining bar). Optimal amounts of the gold ion solution/surfactant (124) and the reducing agent solution (125) are introduced to the seed generating unit (111) at a predetermined rate.

The gold ion/surfactant solution (124) can be introduced through the first opening/inlet (118) while the reducing agent (125) can be introduced through the second opening/inlet (119). Because the second opening/inlet (119) comprises a porous membrane (120), the reducing agent (125) enters the seed generating unit (111) in extremely small quantities via nanochannels. In one embodiment, the reducing agent (125) can be introduced to the seed generating unit (111) at a rate of 1 ml/(min. $cm^2$ of membrane area). In another embodiment, the rate at which the gold ion solution can be introduced can range from about 0.1 ml/(min. cm$^2$) to about 10 ml/(min. cm$^2$). The rates of introduction of the respective solutions can be optimized to achieve the desired shape and size of the nanocrystals.

The contact between the reducing agent (125) and the gold ion/surfactant solution (124) inside the seed generating unit (111) causes the formation of gold nanoparticle seeds. The seed generating unit is designed such that at the point where the reducing agent (125) enters through the second opening/inlet (119), the width of the seed generating unit (111) is reduced or narrowed substantially (132). This may be achieved by any means that will narrow the passage such as a protrusion or a structure integrally formed to reduce the internal diameter or space at that point, a structure attached to the inside wall of the seed generating unit, or an indentation of the walls themselves. By reducing the width of the seed generating unit at this point, an "active zone" (132) is created where the reaction between the two solutions can take place in the entire volume of this zone. In one embodiment, the width is reduced from about 10 mm to about 1 mm. In one specific example, this is achieved by the formation of a trapezoid shaped protrusion (130). The active zone (132) in the trapezoid example can end at the point of a trailing edge (131) of the trapezoid shaped protrusion (130). The purpose of the reduction in internal width or diameter is to perform a spontaneous and fast reagent mixing in the volume of the active zone. Any means of reducing the internal width or diameter of the seed generating unit may be used as long as it can create a defined active zone at the point where the two solutions contact with each other. The reaction conditions can be arranged such that by the time reactants pass the active zone (132), the formation of the gold nanoparticles is substantially completed.

In one embodiment where the reduction of the internal width or diameter of the seed generating unit is reduced using a trapezoid protrusion (as shown in FIG. 4), the gold ion/surfactant solution enters the active zone (132) at the leading edge (133) of the trapezoid shaped protrusion (130). At the leading edge (133), the gold ion solution/surfactant (124) and the reducing agent solution (125) homogeneously contact each other and combine effectively as they cross the active zone (132) resulting in the formation of gold nanoparticle seeds. The conditions are chosen such that by the time the combined solutions (reaction mixture) (126) reach the trailing edge (131), the formation of gold nanoparticles is substantially completed.

Next, the mixture (126) containing the gold nanoparticles is guided to flow towards the second porous outlet (116). Once the combined solution (126) flow reaches the outlet, the pressure of the flow is adjusted such that it enables the solution containing nanoparticles (126) to pass through the porous membrane (116) and into the growth tank (103). The motor that causes the motion of the seed generating unit (121, 122) can be operated while the solution (126) containing the nanoparticles is entering the growth solution. For example, the operation of the motor (122) can cause the retaining bar (121) to move back and forth horizontally along the longitudinal axis of the growth tank (103). The motion of the retaining bar (121) in turn can move the seed generating unit (111) horizontally along the length of the growth tank (103). This motion, combined with the fluid flow of the combined solution, allows the gold nanoparticle seeds to come into contact with the growth solution. The motor can be operated in such a way as to result in optimal movement of the seed generating unit. The rate at which the seed generating unit moves can be any where from about 1 mm per second to about 10 mm per second. In one specific embodiment, the motor (122) is operated such that the seed generating unit (111) moves through the growth tank at a rate of 3.5 mm per second.

After introducing optimal amount of the gold nanoparticles into the growth solution (106), the seed generating unit can be brought to a stationary position (for example by shutting off the motor (121,122) and the seed solution flow to the growth solution can be stopped. In one embodiment, the time taken for the introduction of gold nanoparticles into the growth solution can range from anywhere about a few seconds to about a few minutes. After a sufficient time, the gold nanoparticles in the growth solution (106) grow into optimal gold nanocrystals or nanorods. A variety of well known techniques can be used to monitor the formation of nanorods. For example, the UV-visible absorption of gold nanorods can be measured. In one embodiment, the nanocrystals can be in the form of rods, and the time of contact with the growth solution can be approximately one hour. In one example, the nanocrystals or nanorods formed in the growth tank can be collected through the growth tank outlet (107). After the removal, standard techniques can be performed to purify the nanocrystals. Such procedures include removing the excess chemical reagents, size and shape separation of the nanocrystals.

Many of the parameters of the method may be modified in order to optimize the type and size of the nanocrystals formed. These parameters may include the size of the nanochannels in both of the porous membranes, the flow rate of the reducing agent solution and gold ion solution, the shape of the seed generating unit, the concentrations of the reducing agent solution and the gold ion solution, surfactant and the rate at which to inject the nanoparticle seed solution. By optimizing these parameters the nanocrystals may be formed in other shapes such as stars, spheres and cubes. The apparatus and the methods described above can be used to produce different nanostructures of noble metals including but not limited to gold nanorods.

Figure 6:
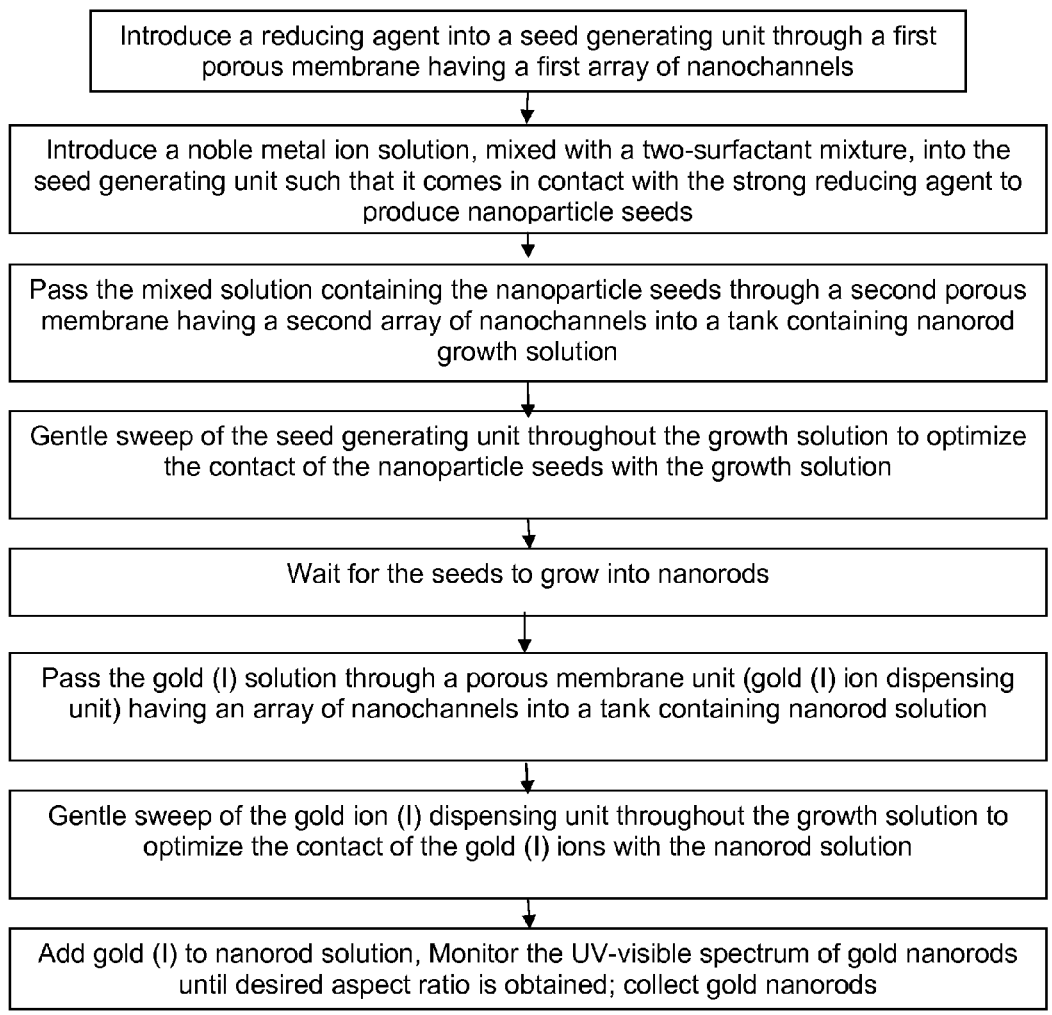
FIG. 6 is a flow chart illustrating a method for forming nanorods with aspect ratio larger than 4.5 according to one aspect of the invention.

In yet another aspect of the disclosure as shown in FIG. 6, the apparatus described in this application can be used to produce nanorods with aspect rations above 4.5. First, the nanocrystal forming apparatus can be used to grow nanocrystals with aspect ratios of 3 to 4 that are coated with two surfactants of CTAB and benzyldimethylammonium chloride (BDAC). Second, the seed generating unit, acting as a fluid dispenser, can be used to homogenously inject gold (I) (growth solution) to a solution of gold nanorods.

In one example, a growth solution will be made from a 200 ml solution of CTAB (0.15 M) and BDAC (0.4 g to 8 g). This solution will be added to 8 ml of AgNO$_3$ (0.004 M). When the growth solution reaches 30° C., a 200 ml solution of HAuC14 (0.001 M) will be added, followed by 2.8 ml of a mild reducing agent such as ascorbic acid (0.0788 M). Using the nanocrystal forming apparatus (101) described above, gold nanoparticles can then be injected to the growth solution. After about 1 hour, roughly 400 ml of a nanorod solution with an aspect ratio of about 4 is produced.

Next, a second growth solution will be made. The growth solution will have 200 ml of 0.15 M BDAC, 4 g of CTAB and 8 ml of 0.0040 M AgNO$_3$ which will be added to a 200 ml solution of HAuCl$_4$ (0.0005 M). This is followed by addition of a 14.4 ml of a mild reducing agent such as ascorbic acid (0.0788 M).

Then, a device similar to the seed generating unit (111) will be inserted in the freshly prepared nanorod solution that was created in the above step. In this example the seed generating unit does not produce seeds, but only functions as a dispenser. The dispenser is realized by just closing the second inlet (119) and feeding gold ions (I) solution through the inlet (119). By using the seed generating unit in this manner, the growth solution, which contains gold ions (I) is homogenously added to the gold nanorod solution. The gradual addition is carried out by sweeping the dispensing unit (111) through out the solution of gold nanorod solution. This results in gradual elongation of the previously formed nanorods. Once certain aspect ratio of nanorods is obtained, the growth process is stopped and product solution may be collected.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

References:
1. Jana, N. R.; Gearheart, L.; Murphy, C. J. "Wet Chemical Synthesis of High Aspect Ratio Cylindrical Gold Nanorods", *J. Phys. Chem. B* 2001, 105, 4065-4067.
2. Nikoobakht, B.; El-Sayed, M. A. "Preparation and Growth Mechanism of Gold Nanorods (NRs) Using Seed-Mediated Growth Method.", *Chem. Mater.* 2003, 15, 1957-1962.
3. Ying, Y.; Chang, S. S.; Lee, C. L.; Wang, C. R. C. "Gold Nanorods: Electrochemical Synthesis and Optical Properties", J. Phys. Chem. B1997, 101, 6661-6664.
4. Kim, F.; Song, J. H.; Yang, P. "Photochemical Synthesis of Gold Nanorods', *J. Am. Chem. Soc.,* 2002, 124, pp 14316-14317.
5. Boleininger, J.; Kurz, A.; Reuss, V.; Sonnichsen, C. "Microfluidic continuous flow synthesis of rod-shaped gold and silver nanocrystals" *Phys. Chem. Chem. Phys.,* 2006, 8, 3824-3827.

The invention claimed is:

1. A method for producing nanocrystals comprising:
providing a first flow solution comprising noble metal ions and a surfactant solution into a seed generating unit;
providing a second flow solution comprising a reducing agent into the seed generating unit;
passing the second flow solution through a first membrane of the seed generating unit;
causing the contact of the first flow solution with the second flow solution, such that the contact of the first flow solution with the second flow solution generates nanoparticle seeds; and
causing the movement of the nanoparticle seeds to a growth unit containing a growth solution through a second membrane of the seed generating unit,
wherein the contact between the nanoparticle seeds and the growth solution resulting from the motion of the seed generating unit inside the growth unit produces nanocrystals, wherein said nanocrystals are produced using a nanocrystal forming apparatus comprising:
the seed generating unit with an anterior end and a posterior end;
a first inlet located at the anterior end of the seed generating unit for receiving the first solution;
a second inlet formed of a side wall of the seed generating unit near the anterior end for receiving the second solution;
an outlet formed of a side wall in the lower half of the seed generating unit;
the first membrane substantially covering the first inlet; and
the second membrane covering the outlet;
the growth solution unit with a distal end and a proximal end; and
a means for causing motion of the seed generating unit operably connected such that when the means is operated the seed generating unit is caused to move through the growth solution unit.

2. The method of claim 1, wherein the horizontal motion of the seed generating unit maximizes the homogeneous distribution and contact of the nanoparticle seeds with the growth solution.

3. The method of claim 1, further comprises removing the growth solution containing the nanocrystals after the nanocrystals are formed.

4. The method of claim 1, wherein the surfactant is a cationic surfactant.

5. The method of claim 4, wherein the cationic surfactant is a cetyltrimethylammonium halide.

6. The method of claim 5, wherein the cetyltrimethylammonium halide is cetyltrimethylammonium bromide.

7. The method of claim 6, wherein the cetyltrimethylammonium bromide concentration is approximately 0.08 M to about 0.2 M.

8. The method of claim 1, wherein the noble metal ion is gold.

9. The method of claim 1, wherein the gold ion concentration is approximately 0.0001 M to about 0.004 M.

10. The method of claim 1, wherein the reducing agent is sodium borohydride.

11. The method of claim 9, wherein the sodium borohydride concentration is approximately 0.005 M to about 0.05 M.

12. The method of claim 1, wherein the first membrane is composed of organic or inorganic materials.

13. The method of claim 11, wherein the first membrane has pores or nanochannels with diameters ranging from about 10 nanometers to about 500 nanometers.

14. The method of claim 13, wherein the second membrane has pores or nanochannels with diameters ranging from about 50 nanometers to about 200 nanometers.

15. The method of claim 1, where the first and the second membrane are identical.

16. The method of claim 1, where the first and the second membrane are different.

17. The method of claim 14, wherein the membrane is made of aluminum oxide.

18. The method of claim 1, wherein the rate of motion of the seed generating unit is in the range from about 0.5 millimeters per second to about 10 millimeters per second.

19. The method of claim 1, wherein the first membrane is composed of aluminum oxide.

20. The method of claim 1, wherein the first membrane has an array of nanochannels having diameter in the range from about 10 nanometers to about 500 nanometers.

21. The method of claim 1, wherein the second membrane has an array of nanochannels having diameter in the range from about 50 nanometers to about 200 nanometers.

22. The method of claim 1, wherein the first membrane and the second membrane are identical.

23. The method of claim 1, wherein the first membrane and the second membrane are different.

24. The method of claim 1, wherein the internal space of the seed generating unit where the second inlet is located is reduced.

25. The method of claim 1, wherein the nanocrystals are rod-shaped.

26. The method of claim 1, wherein the growth solution unit is secured to a base.

27. The method of claim 1, wherein the means for causing the motion is a motor which is operably attached to the seed generating unit.

28. The method of claim 1, wherein the seed generating unit and the growth solution unit are made of at least one of acrylic glass, polycarbonate, and polyethylene.

29. The method of claim 1, wherein a retaining pole connects the means of causing motion to a base.

* * * * *